United States Patent
Teng et al.

(10) Patent No.: US 12,438,334 B2
(45) Date of Patent: Oct. 7, 2025

(54) APPARATUS FOR AND METHOD OF MODULATING A LIGHT SOURCE WAVELENGTH

(71) Applicant: Cymer, LLC, San Diego, CA (US)

(72) Inventors: Kuo-Tai Teng, Poway, CA (US); Rahul Ahlawat, San Diego, CA (US); Piraj Fozoonmayeh, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 911 days.

(21) Appl. No.: 17/609,075

(22) PCT Filed: May 11, 2020

(86) PCT No.: PCT/US2020/032390
§ 371 (c)(1),
(2) Date: Nov. 5, 2021

(87) PCT Pub. No.: WO2020/231946
PCT Pub. Date: Nov. 19, 2020

(65) Prior Publication Data
US 2022/0231474 A1    Jul. 21, 2022

Related U.S. Application Data

(60) Provisional application No. 62/847,464, filed on May 14, 2019.

(51) Int. Cl.
*H01S 3/097* (2006.01)
*G03F 7/00* (2006.01)
(Continued)

(52) U.S. Cl.
CPC ...... *H01S 3/09702* (2013.01); *G03F 7/70491* (2013.01); *H01S 3/10069* (2013.01); *H01S 3/1305* (2013.01)

(58) Field of Classification Search
CPC . H01S 3/1305; H01S 3/10069; H01S 3/09702
See application file for complete search history.

(56) References Cited

U.S. PATENT DOCUMENTS

| 5,142,543 A | 8/1992 | Wakabayashi et al. |
| 6,139,166 A | 10/2000 | Marshall et al. |

(Continued)

FOREIGN PATENT DOCUMENTS

| CN | 109313390 A | 2/2019 |
| DE | 1020122181051 A1 | 8/2019 |

(Continued)

OTHER PUBLICATIONS

Office Action, counterpart Korean Patent Application No. 10-2021-7037050, mailed Jan. 18, 2023, 15 pages total (including English translation of 6 pages).

(Continued)

*Primary Examiner* — Michael Carter
(74) *Attorney, Agent, or Firm* — DiBerardino McGovern IP Group LLC

(57) ABSTRACT

Apparatus for and method of controlling a laser system capable of generating bursts of pulses of laser radiation having multiple alternate wavelengths in which an element controlling the wavelength is pre-positioned between bursts to be between its position for generating one wavelength and its position for generating another wavelength. Also disclosed is a system that determines an optimal control waveform for the element to move between positions using quadratic programming, dynamic programing, inversion feed forward control, or iterative learning control. A data storage device such as a pre-populated lookup table or a field programmable gate array may be used to store at least one optimal control parameter for each of a plurality of repetition rates.

21 Claims, 5 Drawing Sheets

(51) Int. Cl.
  *H01S 3/10* (2006.01)
  *H01S 3/13* (2006.01)

(56) References Cited

U.S. PATENT DOCUMENTS

| | | |
|---|---|---|
| 6,243,405 B1 | 6/2001 | Borneis et al. |
| 6,541,731 B2 | 4/2003 | Mead et al. |
| 6,671,294 B2 | 12/2003 | Kroyan et al. |
| 6,721,340 B1* | 4/2004 | Fomenkov .......... G03F 7/70933 372/57 |
| 6,735,225 B2 | 5/2004 | Albrecht et al. |
| 6,829,040 B1 | 12/2004 | Kye et al. |
| 6,853,653 B2 | 2/2005 | Spangler et al. |
| 7,002,443 B2 | 2/2006 | Ness et al. |
| 7,039,086 B2 | 5/2006 | Fallon et al. |
| 7,079,564 B2 | 7/2006 | Fallon et al. |
| 7,088,758 B2 | 8/2006 | Sandstrom et al. |
| 7,154,928 B2 | 12/2006 | Sandstrom et al. |
| 7,158,553 B2 | 1/2007 | Govorkov et al. |
| 7,256,870 B2 | 8/2007 | Finders |
| 7,286,207 B2 | 10/2007 | Nolscher et al. |
| 7,408,714 B2 | 8/2008 | Windpassinger et al. |
| 7,525,638 B2 | 4/2009 | Buurman et al. |
| 7,534,552 B2 | 5/2009 | De Kruif et al. |
| 7,612,868 B2 | 11/2009 | Tsuchiya |
| 7,965,387 B2 | 6/2011 | Hagiwara |
| 8,309,885 B2 | 11/2012 | Peng et al. |
| 8,705,004 B2* | 4/2014 | Butler .................. G03F 7/70525 355/55 |
| 8,938,694 B2 | 1/2015 | Liu et al. |
| 8,989,225 B2 | 3/2015 | Kakizaki et al. |
| 9,207,119 B2 | 12/2015 | Rokitski et al. |
| 9,235,136 B2 | 1/2016 | Epple |
| 9,599,510 B2 | 3/2017 | Duffey et al. |
| 9,625,824 B2 | 4/2017 | Lu et al. |
| 9,989,864 B2 | 6/2018 | Baselmans et al. |
| 9,989,866 B2 | 6/2018 | Mason et al. |
| 2002/0006149 A1 | 1/2002 | Spangler et al. |
| 2002/0048288 A1* | 4/2002 | Kroyan .................. H01S 3/036 372/55 |
| 2002/0106821 A1 | 8/2002 | Bode et al. |
| 2002/0126479 A1 | 9/2002 | Zhai et al. |
| 2002/0154669 A1* | 10/2002 | Spangler ............. G03F 7/70041 372/55 |
| 2003/0016708 A1 | 1/2003 | Albrecht et al. |
| 2003/0090643 A1 | 5/2003 | Sato |
| 2003/0178583 A1 | 9/2003 | Kampherbeek et al. |
| 2003/0219094 A1 | 11/2003 | Basting et al. |
| 2004/0057489 A1 | 3/2004 | Fallon et al. |
| 2004/0107012 A1 | 6/2004 | Das et al. |
| 2005/0078292 A1 | 4/2005 | Bruebach |
| 2005/0083983 A1 | 4/2005 | Sandstrom et al. |
| 2005/0128553 A1 | 6/2005 | Toyama et al. |
| 2005/0247683 A1 | 11/2005 | Agarwal et al. |
| 2005/0265417 A1 | 12/2005 | Fallon et al. |
| 2006/0261050 A1 | 11/2006 | Krishnan et al. |
| 2007/0013889 A1 | 1/2007 | Jorritsma et al. |
| 2007/0222961 A1 | 9/2007 | Schmidt |
| 2007/0260419 A1 | 11/2007 | Hagiwara |
| 2009/0002666 A1 | 1/2009 | Tsuchiya |
| 2009/0219498 A1 | 9/2009 | Kono |
| 2009/0251093 A1 | 10/2009 | Miyazaki |
| 2010/0177794 A1 | 7/2010 | Peng et al. |
| 2012/0087386 A1 | 4/2012 | Brown et al. |
| 2013/0279526 A1 | 10/2013 | Kakizaki et al. |
| 2013/0304236 A1 | 11/2013 | Benosman |
| 2014/0195993 A1 | 7/2014 | Liu et al. |
| 2014/0236516 A1 | 8/2014 | Pforr |
| 2015/0380893 A1 | 12/2015 | Matsunaga et al. |
| 2016/0219684 A1 | 7/2016 | Kaskey et al. |
| 2016/0299441 A1* | 10/2016 | Ahlawat .............. G03F 7/70575 |
| 2016/0320708 A1 | 11/2016 | Lu et al. |
| 2016/0341602 A1 | 11/2016 | Thornes |
| 2017/0063025 A1 | 3/2017 | Wakabayashi et al. |
| 2017/0160647 A1 | 6/2017 | Baselmans et al. |
| 2017/0176879 A1 | 6/2017 | Witte et al. |
| 2017/0187160 A1 | 6/2017 | Lowder et al. |
| 2017/0279241 A1 | 9/2017 | Onose et al. |
| 2017/0315456 A1 | 11/2017 | Lin et al. |
| 2018/0109068 A1 | 4/2018 | Conley et al. |
| 2018/0123312 A1 | 5/2018 | Furusato et al. |
| 2018/0224814 A1 | 8/2018 | Elbsat et al. |
| 2018/0254600 A1 | 9/2018 | Kumazaki et al. |
| 2018/0323568 A1* | 11/2018 | Furusato ................. H01S 3/137 |

FOREIGN PATENT DOCUMENTS

| | | |
|---|---|---|
| JP | 2003031881 A | 1/2003 |
| JP | 2003051633 A | 2/2003 |
| JP | 2004526313 A | 8/2004 |
| JP | 2004288161 A | 10/2004 |
| JP | 2005501399 A | 1/2005 |
| JP | 2005173377 A | 6/2005 |
| JP | 2007192902 A | 8/2007 |
| JP | 4577064 B2 | 11/2010 |
| JP | 4580246 B2 | 11/2010 |
| JP | 2015513706 A | 5/2015 |
| JP | 2018517278 A | 6/2018 |
| KR | 100794893 B1 | 1/2008 |
| KR | 20170136575 A | 12/2017 |
| TW | 492234 B | 6/2002 |
| TW | 200512546 A | 4/2005 |
| TW | 200601732 A | 1/2006 |
| TW | 200737625 A | 10/2007 |
| TW | 201706579 A | 2/2017 |
| TW | 201725355 A | 7/2017 |
| WO | 2003096492 A2 | 11/2003 |
| WO | 2007096993 A1 | 8/2007 |
| WO | 2008052153 A2 | 5/2008 |
| WO | 2009018664 A2 | 2/2009 |
| WO | 2016209669 A1 | 12/2016 |
| WO | 2017026000 A1 | 2/2017 |
| WO | 2017050506 A1 | 3/2017 |
| WO | 2017098625 A1 | 6/2017 |
| WO | 2017134745 A1 | 8/2017 |
| WO | 2017213069 A1 | 12/2017 |
| WO | 2019079010 A1 | 4/2019 |
| WO | 2019174885 A1 | 9/2019 |
| WO | 2019190700 A1 | 10/2019 |

OTHER PUBLICATIONS

Office Action, counterpart Japanese Patent Application No. 2021-562781, mailed Nov. 9, 2022, 7 pages total (including English translation of 4 pages).

Robert Laenen, European International Searching Authority, International Search Report and Written Opinion, counterpart PCT Application No. PCT/US2020/032390, mailed Aug. 4, 2020, 13 pages total.

* cited by examiner

APPARATUS FOR AND METHOD OF MODULATING A LIGHT SOURCE WAVELENGTH

CROSS REFERENCE TO RELATED APPLICATION

This application claims priority to U.S. Application No. 62/847,464, filed May 14, 2019 and titled APPARATUS FOR AND METHOD OF MODULATING A LIGHT SOURCE WAVELENGTH, and which is incorporated herein in its entirety by reference.

TECHNICAL FIELD

The present disclosure relates systems and methods for generating multiple laser beams for use, for example, in a lithographic apparatus.

BACKGROUND

A lithographic apparatus applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

Lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate. Herein, for the sake of simplicity, both steppers and scanners will be referred to simply as scanners.

The light source used to illuminate the pattern and project it onto the substrate can be of any one of a number of configurations. Deep ultraviolet excimer lasers commonly used in lithography systems include the krypton fluoride (KrF) laser at 248 nm wavelength and the argon fluoride (ArF) laser at 193 nm wavelength. Generally, an excimer laser is designed to operate with a specific gas mixture; therefore, changing wavelength can be complicated. In particular, changing the center wavelength from one discharge to the next ("shot-to-shot") is challenging.

There may be instances, however, where it is desired to have the ability to change wavelength. For example, in 3D NAND tiers of memory (that is, memory in which the structure resembles NAND (not AND) gates stacked on top of each other). The transition from 2D to 3D NAND architecture requires significant changes in manufacturing processes. In 3D NAND fabrication the challenges are driven primarily by the processes of etching and deposition at extreme aspect ratios (ratio of a hole diameter to its depth). Creating complex 3D structures with very high-aspect-ratio (HAR) features is complicated and requires extreme precision and, ultimately, process uniformity and repeatability to achieve scale. Moreover, as multi-layered stack heights increase, so does the difficulty in achieving consistent etch and deposition results at the top and the bottom of the stack, e.g., a memory array.

These considerations lead to a need for a greater depth of focus. Lithography depth of focus DOF is determined by the relationship $DOF = \pm m_2 \lambda/(NA)^2$ where $\lambda$ is the wavelength of the illuminating light, NA is numerical aperture, and $m_1$ and $m_2$ are practical factors depending on the resist process. Due to greater depth-of-focus requirements in 3D NAND lithography, sometimes more than one exposure pass is made over a wafer using a different laser wavelength for each pass.

In addition, the materials making up the lenses that focus the laser radiation are dispersive so different wavelengths come to focus at different depths. This is another reason why it may be desirable to have the ability to change wavelengths.

A DUV light source includes systems for controlling the wavelength of the DUV light. Typically these wavelength control systems include feedback and feed-forward compensators to promote wavelength stability. Characteristically it is expected that the target or reference wavelength, that is, the wavelength commanded by the wavelength control system, will not change rapidly during laser operation. The controller is therefore primarily engaged in rejecting transient disturbances. The feed-forward compensator also compensates for commanded changes in the wavelength target, that is, wavelength change events, which are expected to be infrequent. When such an event occurs, for example, to achieve a wavelength set point change of 600 fm, typically a settling time on the order of about 100 ms must be allowed for the system to settle stably to the new wavelength. This normally exceeds the time between pulses so that under the use case where target wavelength set point is changed about 500 fm between pulses, such a control system will not be able to provide the desired wavelength tracking performance.

As a specific example, in an application of generating DUV light at two different wavelengths, the reference wavelength has two set points during exposure, that is, a first set point at a first wavelength and a second set point at a second wavelength. The reference wavelength will then be modulated between these two set points. Every wavelength target change requires a predetermined settling time. This limits the rate at which the reference wavelength can be modulated. In addition, the wavelength during the transient settling period is essentially uncontrolled. This places a constraint on the allowable wait times between wavelength target changes.

It is desirable have the ability to change the reference wavelength between pulses, that is, on a pulse-to-pulse basis. This ability can be realized by reducing the transient settling period. It is also desirable to reduce or even eliminate the wait time between reference wavelength changes.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment, the transient period caused by changing the reference wavelength is shortened by preparing the actuator by pre-positioning the actuator between bursts to achieve the upcoming new target wavelength between bursts.

According to another aspect, wavelength control is achieved through the use of an actuator such as a piezoelectric actuator in a line narrowing module. An optimal control waveform for actuating the actuator to minimize the difference between actual wavelength and wavelength targets is computed based on a dynamic model of the actuator. The optimal control waveform can be computed using any one of several methods. For example, the optimal control waveform may be computed using quadratic programming with constraints, and/or dynamic programming to generate the optimal control signal for given wavelength targets. A pre-populated look-up-table may be used which contains optimal control parameters for at least some of the different repetition rates at which the source may be operated.

As another example, the optimal control waveform may be determined using model inversion feedforward control. This method relies on the actuator dynamic model to construct a digital filter that inverts the actuator dynamic. By passing the waveform of the desired actuator trajectory through this filter, an optimal control waveform can be generated in real-time to achieve zero steady state error tracking. Here and elsewhere, the term "trajectory" is used to refer to the characteristics of motion of the actuator including acceleration.

As another example, an optimal solution to achieve two separate wavelengths is accomplished using a learning algorithm to achieve error convergence over several iterations of learning. The proposed method is able to achieve two separate wavelengths of 1000 fm of separation with separation error below 20 fm.

According to another aspect, the optimal control waveform may be fed to the actuator at very high rate by using field programmable gate array (FPGA).

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
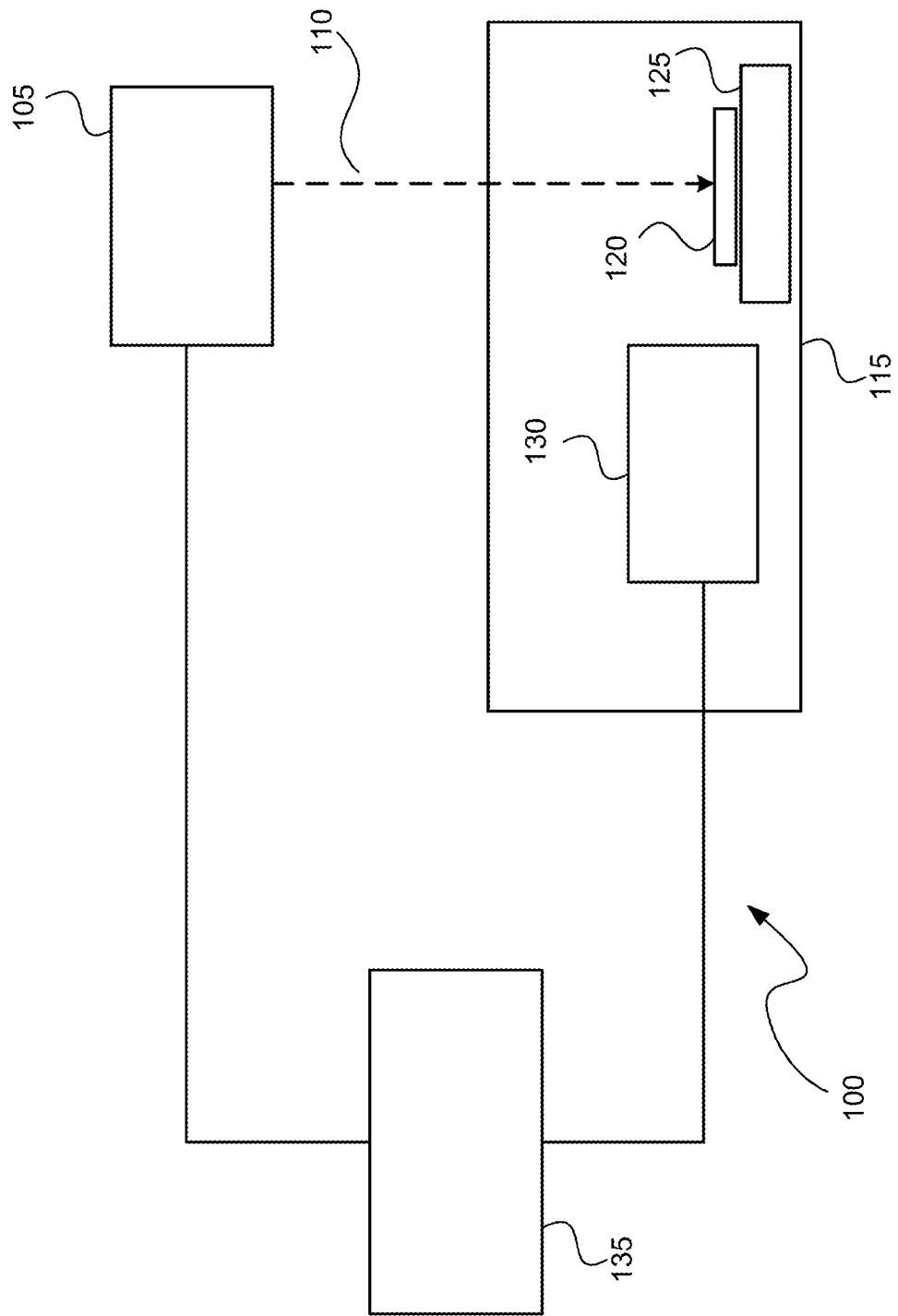
FIG. 1 shows a schematic, not to scale, view of an overall broad conception of a photolithography system according to an aspect of the disclosed subject matter.

Before describing embodiments in more detail, it is instructive to present an example environment in which embodiments of the present invention may be implemented. Referring to FIG. 1, a photolithography system 100 includes an illumination system 105. As described more fully below, the illumination system 105 includes a light source that produces a pulsed light beam 110 and directs it to a photolithography exposure apparatus or scanner 115 that patterns microelectronic features on a wafer 120. The wafer 120 is placed on a wafer table 125 constructed to hold wafer 120 and connected to a positioner configured to accurately position the wafer 120 in accordance with certain parameters.

The photolithography system 100 uses a light beam 110 having a wavelength in the deep ultraviolet (DUV) range, for example, with wavelengths of 248 nanometers (nm) or 193 nm. The minimum size of the microelectronic features that can be patterned on the wafer 120 depends on the wavelength of the light beam 110, with a lower wavelength permitting a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths. The scanner 115 includes an optical arrangement having, for example, one or more condenser lenses, a mask, and an objective arrangement. The mask is movable along one or more directions, such as along an optical axis of the light beam 110 or in a plane that is perpendicular to the optical axis. The objective arrangement includes a projection lens and enables the image transfer to occur from the mask to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120 based on, for example, the mask used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

Figure 2:
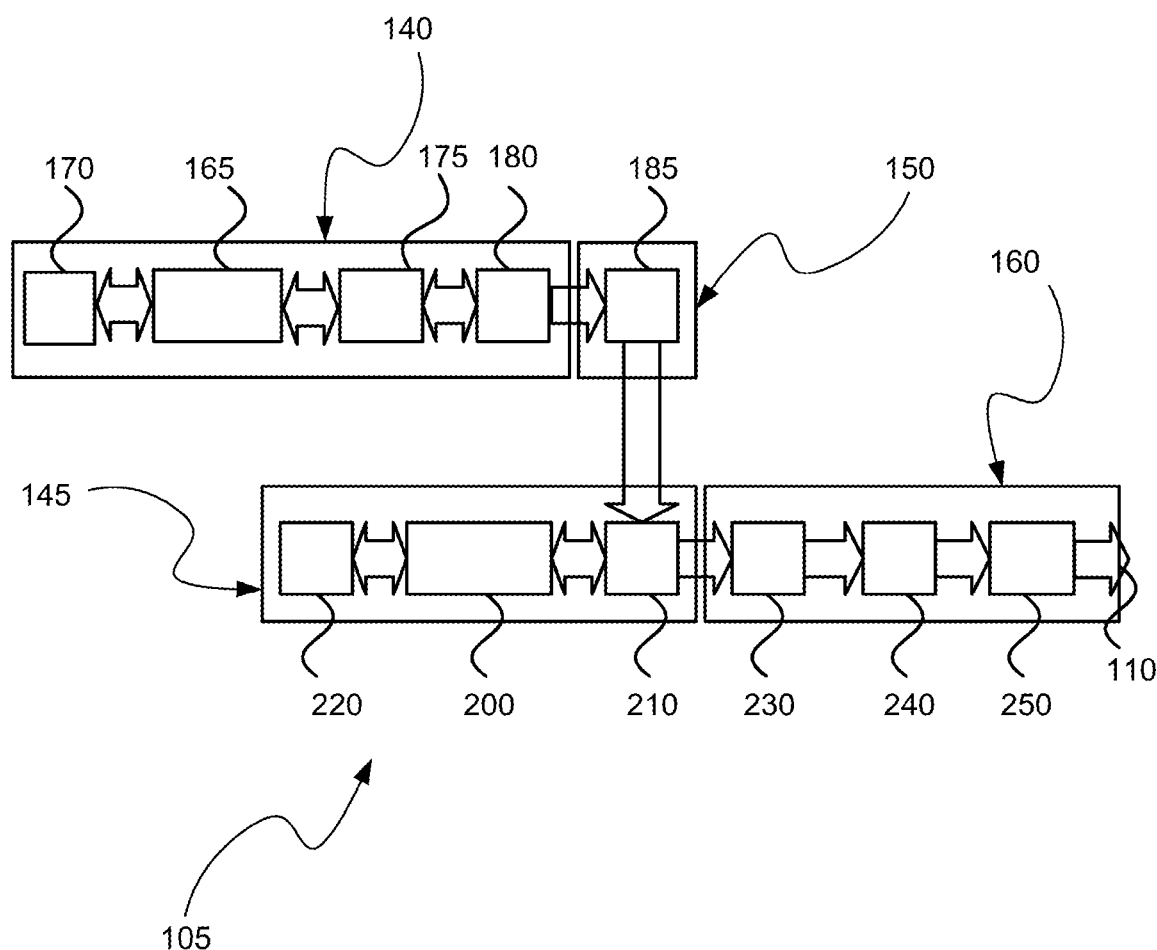
FIG. 2 shows a schematic, not to scale, view of an overall broad conception of an illumination system according to an aspect of the disclosed subject matter.

Referring to FIG. 2, an exemplary illumination system 105 is a pulsed laser source that produces a pulsed laser beam as the light beam 110. FIG. 2 shows illustratively and in block diagram a gas discharge laser system according to an embodiment of certain aspects of the disclosed subject matter. The gas discharge laser system may include, e.g., a solid state or gas discharge seed laser system 140, an amplification stage, e.g., a power ring amplifier ("PRA") stage 145, relay optics 150 and laser system output subsystem 160. The seed system 140 may include, e.g., a master oscillator ("MO") chamber 165.

The seed laser system 140 may also include a master oscillator output coupler ("MO OC") 175, which may comprise a partially reflective mirror, forming with a reflective grating (not shown) in a line narrowing module ("LNM") 170, an oscillator cavity in which the seed laser 140 oscillates to form the seed laser output pulse, i.e., forming a master oscillator ("MO"). The system may also include a line-center analysis module ("LAM") 180. The LAM 180 may include an etalon spectrometer for fine wavelength measurement and a coarser resolution grating spectrometer. A MO wavefront engineering box ("WEB") 185 may serve to redirect the output of the MO seed laser system 140 toward the amplification stage 145, and may include, e.g., beam expansion with, e.g., a multi prism beam expander (not shown) and coherence busting, e.g., in the form of an optical delay path (not shown).

The amplification stage 145 may include, e.g., a PRA lasing chamber 200, which may also be an oscillator, e.g., formed by seed beam injection and output coupling optics (not shown) that may be incorporated into a PRA WEB 210 and may be redirected back through the gain medium in the chamber 200 by a beam reverser 220. The PRA WEB 210 may incorporate a partially reflective input/output coupler (not shown) and a maximally reflective mirror for the nominal operating wavelength (e.g., at around 193 nm for an ArF system) and one or more prisms.

A bandwidth analysis module ("BAM") 230 at the output of the amplification stage 145 may receive the output laser light beam of pulses from the amplification stage and pick off a portion of the light beam for metrology purposes, e.g., to measure the output bandwidth and pulse energy. The laser output light beam of pulses then passes through an optical pulse stretcher ("OPuS") 240 and an output combined autoshutter metrology module ("CASMM") 250, which may also be the location of a pulse energy meter. One purpose of the OPuS 240 may be, e.g., to convert a single output laser pulse into a pulse train. Secondary pulses created from the original single output pulse may be delayed with respect to each other. By distributing the original laser pulse energy into a train of secondary pulses, the effective pulse length of the laser can be expanded and at the same time the peak pulse intensity reduced. The OPuS 240 can thus receive the laser beam from the PRA WEB 210 via the BAM 230 and direct the output of the OPuS 240 to the CASMM 250. Other suitable arrangements may be used in other embodiments.

The PRA lasing chamber 200 and the MO 165 are configured as chambers in which electrical discharges between electrodes may cause lasing gas discharges in a lasing gas to create an inverted population of high energy molecules, including, e.g., Ar, Kr, and/or Xe, to produce relatively broad band radiation that may be line narrowed to a relatively very narrow bandwidth and center wavelength selected in a line narrowing module ("LNM") 170, as is known in the art.

Typically the tuning takes place in the LNM. A typical technique used for line narrowing and tuning of lasers is to provide a window at the back of the laser's discharge cavity through which a portion of the laser beam passes into the LNM. There, the portion of the beam is expanded with a prism beam expander and directed to a grating which reflects a narrow selected portion of the laser's broader spectrum back into the discharge chamber where it is amplified. The laser is typically tuned by changing the angle at which the beam illuminates the grating using an actuator such as, for example, a piezoelectric actuator.

As set forth above, for some applications it is beneficial to be able to generate a burst of one or more pulses having one wavelength and then be able to switch to generating a burst of one or more pulses having a different wavelength. Trying to achieve this between pulses, however, is challenging because the settling time, that is, the amount of time it takes the system to stabilize after a wavelength change, is typically longer than the interpulse interval. According to one aspect, the transient settling period caused by changing the reference wavelength is shortened by preparing the actuator by pre-positioning the actuator between bursts to achieve the an upcoming new target wavelength between bursts.

According to another aspect, a dynamic model of the actuator is used to compute an optimal control waveform for actuating the actuator to minimize the difference between actual wavelength and wavelength targets.

The optimal control waveform can be computed using any one of several methods. For example, the optimal control waveform may be computed using dynamic programming. This method is well adapted for dealing with complex models that contain nonlinear dynamics. If an actuator model is adopted that has strong nonlinear dynamics, then dynamic programming may be used to generate the optimal control signal for given wavelength targets. Dynamic programming does, however, present the challenge that it requires significant computational resources which may not be implementable in real-time. To overcome this a data storage device such as a pre-populated look-up-table or a pre-programmed field programmable gate array (FPGA) may be used which contains optimal control parameters for at least some of the different repetition rates at which the source may be operated.

As another example, the optimal control waveform may be determined using model inversion feedforward control. This method relies on the actuator dynamic model to construct a digital filter that inverts the actuator dynamic. By passing the desired waveform for the desired actuator trajectory through this filter, an optimal control waveform can be generated in real time to achieve zero steady state error tracking.

As another example, an optimal solution to achieve two separate wavelengths in a stable manner is accomplished using a learning algorithm to guarantee error convergence over several iterations of learning. Embodiments of the systems and methods disclosed herein can potentially achieve two separate wavelengths separated by 1000 fm with a separation error below 20 fm.

According to another aspect, the optimal control waveform may be fed to the actuator at a very high rate by using a FPGA.

Figure 3:
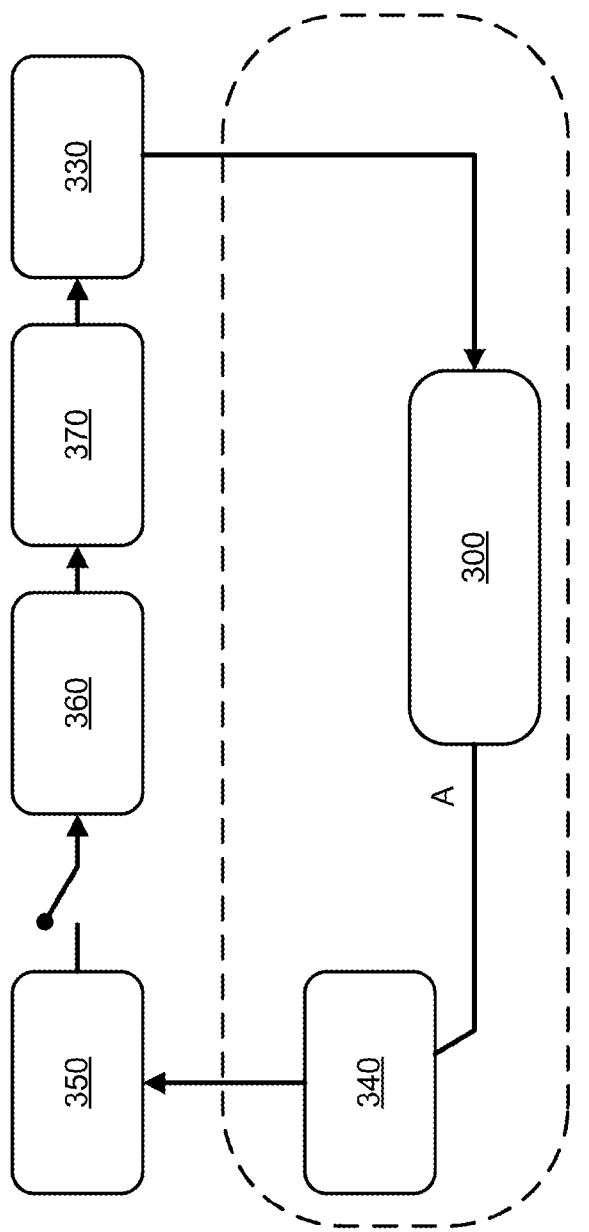
FIG. 3 is a functional block diagram of a two chamber laser system according to an aspect of an embodiment.

The control system may include a combination of feed-forward control and iterative learning control (ILC). As shown in FIG. 3, a feed-forward control signal A is computed offline by ILC module 300 using a wavelength measurement from streaming data acquisition unit 330 and an ILC update law as will be described below. A bandwidth wavelength control module (BWCM) 340 uses the feed-forward control signal A to update pre-defined data in a data storage unit such as an FPGA included in the BWCM 340. The BWCM 340 then actuates a PZT 350 at, for example, 60 kHz when the laser is pulsing. The wavelength of the laser radiation is measured by a line center (center wavelength) analysis module (LAM) 360 and fire control platform or processor (FCP) 370, and a wavelength measurement is collected into data acquisition unit 330 at 6 kHz.

It will be appreciated that the system shown in FIG. 3 may be configured to encompass multiple frequency regimes. The area inside the broken box denotes processes that may occur essentially offline. The PZT 350 may be driven at about 60 kHz. Wavelength data may be acquired at about 6 kHz.

In order to account for constraints on the change of PZT voltage, quadratic programming with constraints may be used to help find the optimal feed-forward signal within the feasible region of operation. Quadratic programming is a technique that finds the optimal solution to a given quadratic cost function with constraints mathematically.

The standard QP solver can solve a problem with the following structure:

$$\min_X \left(\frac{1}{2} X^T H X + f^T X\right)$$
$$\text{s.t. } LX \le b$$

where X is the design parameter that can be freely chosen except that it has to satisfy $LX \le b$. In other words, the QP solver finds the optimal X that minimizes the cost function within a feasible region defined by $LX \le b$.

In the application being described here, the objective is to find the feed-forward control that satisfies the actuator constraints while minimizing the error between actuator position and the desired control waveform. The PZT dynamic can be expressed in the following state-space form:

$$x(k+1)=Ax(k)+Bu(k)$$

$$y(k+1)=Cx(k+1)$$

where A, B, C are the state, input, and output matrices, respectively, that describe the PZT dynamics; x is the state vector, it is the input vector, and y is the output from PZT.

Substituting the above dynamic model, the original cost function can be rewritten as $$\min_U \left(\frac{1}{2} U^T P^T Q P U - R^T Q P U\right)$$
$$\text{s.t. } DU \le l$$

This fits into the standard QP form where $$H=P^T Q P$$

$$f=-P^T Q R$$

$$X=U$$

$$L=D$$

$$b=l$$

and P describes the PZT input-output dynamics, Q is the weighting function, R denotes the desired control waveform, D represents the actuator constraints, and l is the threshold on the actuator constraints.

According to another aspect, ILC control can be described by the following equations:

$$U_k=U_{k-1}+LE_{k-1}$$

where $U_k$ is the feedforward control signal used at kth iteration, L is the learning function that dictates the convergence of the ILC algorithm, and $E_k$ is the error at kth iteration The stability and convergence property of the ILC control can be derived by combining the ILC control law with the dynamic model of the system as $$E_k=(I-PL)E_{k-1}$$

where P is the matrix that describes the input-output relation of the system, and I is the identity matrix. Stability is guaranteed if the absolute value of all the eigenvalues of (I−PL) is smaller than 1. The convergence rate is also determined by the matrix (I−PL). If (I−PL)=0 then the error would converge to 0 after one iteration.

Figure 4:
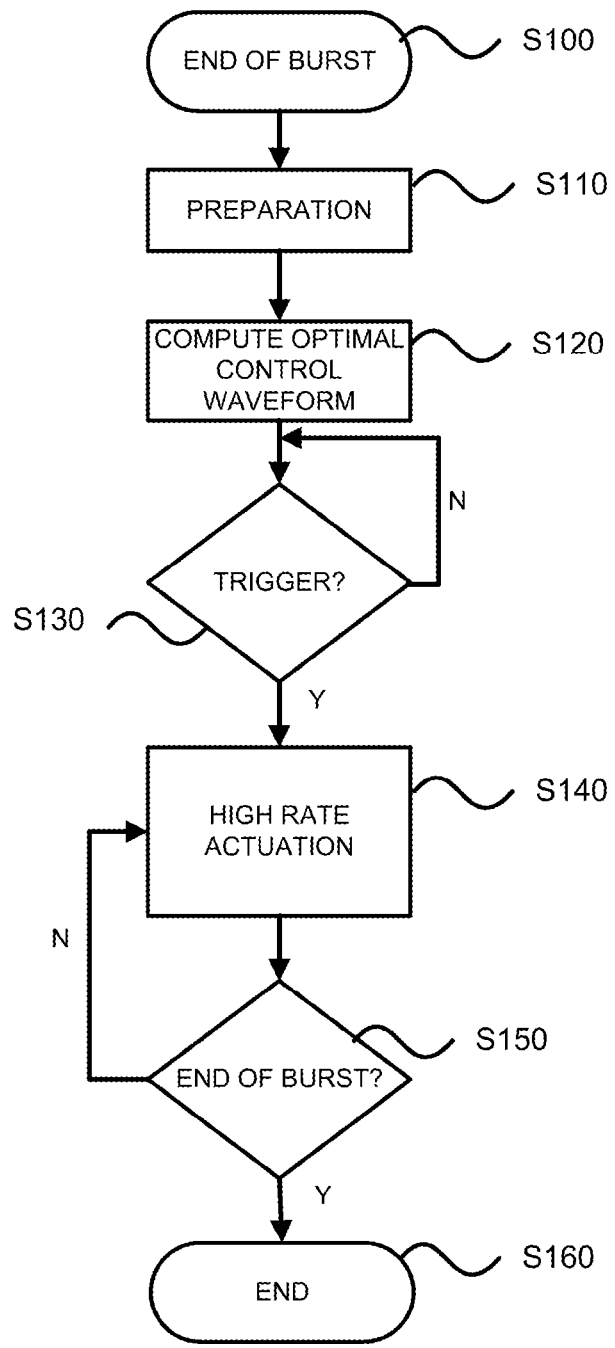
FIG. 4 is a diagram of a possible relative timing of discharges in two laser chambers according to an aspect of an embodiment.

FIG. 4 is a flowchart showing a method of controlling a radiation source according to one aspect of an embodiment. In a step S100 a prior burst of pulses has ended. In step S110 the actuator is prepared by pre-positioning it to a position which is between the position it should be in to produce pulses having a first frequency and the position it should be to produce pulses having second frequency. In a step S120 an optimal control waveform is computed using one or more of the techniques described above. In a step S130 it is determined whether a new burst has been triggered. If "yes" a new burst has been triggered, then in a step S140 the parameters for operation at a commanded repetition rate and frequency are relayed to the source using, for example, an FPGA. In step S150 it is determined whether the current burst has ended. If the current burst has not ended, then step S140 is repeated. If the burst has ended, then the process ends at step S160.

Figure 5:
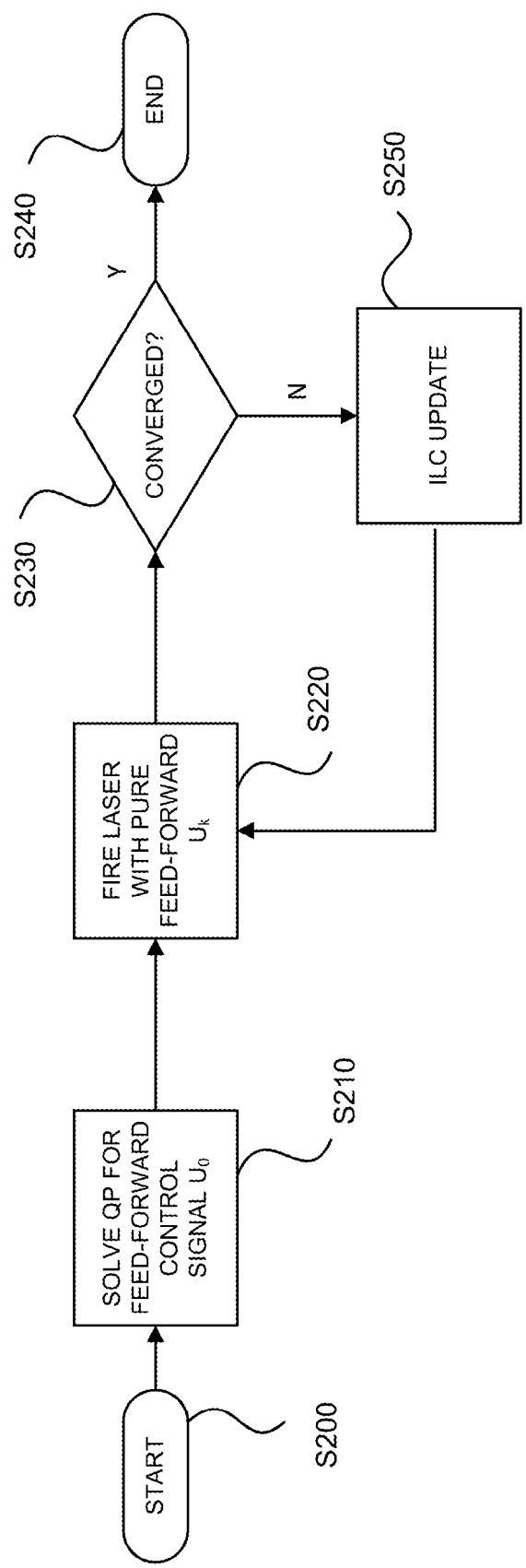
FIG. 5 is a diagram of another possible relative timing of discharges in two laser chambers according to an aspect of an embodiment.

FIG. 5 shows a method performed by the ILC for computing its update law with an initial QP feedforward control signal. In a step S210 quadratic programming is used to develop an initial feedforward control signal. In a step S220 the feedforward control signal as used to fire the laser. In a step S230, it is determined whether the error in the feedforward signal has converged. If the error has not converged, then in step S250 iterative learning is used to update the control signal. The new control signal is then used to fire the laser in step S220. If the error has converged then the process ends as in step S240.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Other aspects of the invention are set out in the following numbered clauses.

1. A laser system comprising:
an actuator having a first state in which the actuator causes the laser system to generate a first burst of one or more pulses of laser radiation having a first wavelength and a second state in which the actuator causes the laser system to generate a second burst of one or more pulses of laser radiation having a second wavelength different from the first wavelength; and an actuator controller arranged to supply a signal to the actuator to cause the actuator to assume a third state between bursts which is intermediate the first state and the second state.

2. A laser system as in clause 1 wherein the first state is a first position, the second state is a second position, and the third state is a third position between the first position and the second position.

3. A laser system comprising:
an actuator having a first state in which the actuator causes the laser system to generate a first burst of one or more pulses of laser radiation having a first wavelength and a second state in which the actuator causes the laser system to generate a second burst of one or more pulses of laser radiation having a second wavelength different from the first wavelength; and
an actuator controller arranged to supply a signal to the actuator to cause the actuator to transition from the first state to the second state, the actuator controller comprising a module arranged to compute an optimal control waveform for the signal for the actuator to transition from the first state to the second state, the actuator controller causing the actuator to transition from the first state to the second state along a trajectory under control of the optimal control waveform.

4. A laser system as in clause 3 wherein the module is adapted to compute the optimal control waveform using quadratic programming with constraints.

5. A laser system as in clause 3 wherein the module is adapted to compute the optimal control waveform using dynamic programming.

6. A laser system as in clause 3 wherein the module is adapted to compute the optimal control waveform using model inversion feedforward control.

7. A laser system as in clause 3 wherein the module is adapted to compute the optimal control waveform using iterative learning control.

8. A laser system as in any one of clauses 3-7 in which the module further comprises means for storing at least one optimal control parameter for each of a plurality of repetition rates.

9. A laser system as in clause 8 wherein the means for storing at least one optimal control parameter for each of a plurality of repetition rates comprises a pre-populated lookup table.

10. A laser system as in clause 8 wherein the means for storing at least one optimal control parameter for each of a plurality of repetition rates comprises a field programmable gate array.

11. A method of controlling a laser system, the method comprising the steps of:
placing an actuator in a first state in which the actuator causes the laser system to generate a first burst of one or more pulses of laser radiation having a first wavelength; and
placing the actuator in a second state in which the actuator causes the laser system to generate a second burst of one or more pulses of laser radiation having a second wavelength different from the first wavelength,
the method further comprising a third step, between the step of placing the actuator in the first state and placing the actuator in the second state, of placing the actuator in a third state which is intermediate the first state and the second state.

12. A method of controlling a laser system as in clause 11 wherein the first state is a first position, the second state is a second position, and the third state is a third position between the first position and the second position.

13. A method of controlling a laser system, the method comprising the steps of:

placing an actuator in a first state in which the actuator causes the laser system to generate a first burst of one or more pulses of laser radiation having a first wavelength; and placing the actuator in a second state in which the actuator causes the laser system to generate a second burst of one or more pulses of laser radiation having a second wavelength different from the first wavelength, wherein the step of placing the actuator in the second state comprises computing an optimal control waveform for the actuator to transition from the first state to the second state and causing the actuator to transition from the first state to the second state along a trajectory under control of the optimal control waveform.

14. A method of controlling a laser system as in clause 13 wherein the computing of an optimal control waveform for the actuator to transition from the first state to the second state comprises using quadratic programming with constraints.

15. A method of controlling a laser system as in clause 13 wherein the computing of an optimal control waveform for the actuator to transition from the first state to the second state comprises using dynamic programming.

16. A method of controlling a laser system as in clause 13 wherein the computing of an optimal control waveform for the actuator to transition from the first state to the second state comprises using model inversion feedforward control.

17. A method of controlling a laser system as in clause 13 wherein the computing of an optimal control waveform for the actuator to transition from the first state to the second state comprises using iterative learning control.

18. A method of controlling a laser system as in any one of clauses 13-17 wherein the computing of an optimal control waveform for the actuator to transition from the first state to the second state comprises storing means for storing at least one optimal control parameter for each of a plurality of repetition rates.

19. A method of controlling a laser system as in clause 18 wherein storing at least one optimal control parameter for each of a plurality of repetition rates is carried out using a pre-populated lookup table.

20. A method of controlling a laser system as in clause 18 wherein storing at least one optimal control parameter for each of a plurality of repetition rates comprises using a field programmable gate array.

21. A method of controlling a laser system, the method comprising the steps of:

placing an actuator in a first state in which the actuator causes the laser system to generate a first burst of one or more pulses of laser radiation having a first wavelength; and placing the actuator in a second state in which the actuator causes the laser system to generate a second burst of one or more pulses of laser radiation having a second wavelength different from the first wavelength, the method further comprising a third step, between the step of placing the actuator in the first state and placing the actuator in the second state, of placing the actuator in a third state which is intermediate the first state and the second state, wherein the step of placing the actuator in the second state comprises computing an optimal control waveform for causing the actuator to transition from the first state to the second state along an optimal trajectory.

The invention claimed is:

1. A laser system comprising:
an actuator having a first state in which the actuator causes a first burst of one or more pulses of laser radiation produced by the laser system to have a first reference wavelength and a second state in which the actuator causes a next burst of one or more pulses of laser radiation produced by the laser system to have a second reference wavelength different from the first reference wavelength; and
an actuator controller arranged to pre-position the actuator in a third state between the first burst and the next burst, the third state being between the first state and the second state.

2. A laser system as claimed in claim 1 wherein the first state is a first position, the second state is a second position, and the third state is a third position between the first position and the second position.

3. A laser system comprising:
an actuator having a first state in which the actuator causes a first burst of one or more pulses of laser radiation produced by the laser system to have a first reference wavelength and a second state in which the actuator causes a next burst of one or more pulses of laser radiation produced by the laser system to have a second reference wavelength different from the first reference wavelength; and
an actuator controller arranged to supply a signal to the actuator to cause the actuator to transition from the first state to the second state, the actuator controller comprising a module arranged to compute an optimal control waveform for the signal for the actuator to transition from the first state to the second state, the actuator controller causing the actuator to transition from the first state to the second state along a trajectory under control of the optimal control waveform.

4. A laser system as claimed in claim 3 wherein the module is adapted to compute the optimal control waveform using quadratic programming with constraints.

5. A laser system as claimed in claim 4 in which the module further comprises means for storing at least one optimal control parameter for each of a plurality of repetition rates.

6. A laser system as claimed in claim 5 wherein the means for storing at least one optimal control parameter for each of a plurality of repetition rates comprises a pre-populated lookup table.

7. A laser system as claimed in claim 5 wherein the means for storing at least one optimal control parameter for each of a plurality of repetition rates comprises a field programmable gate array.

8. A laser system as claimed in claim 3 wherein the module is adapted to compute the optimal control waveform using dynamic programming.

9. A laser system as claimed in claim 3 wherein the module is adapted to compute the optimal control waveform using model inversion feedforward control.

10. A laser system as claimed in claim 3 wherein the module is adapted to compute the optimal control waveform using iterative learning control.

11. A method of controlling a laser system, the method comprising:
   placing an actuator in a first state in which the actuator causes a first burst of one or more pulses of laser radiation produced by the laser system to have a first reference wavelength; and
   placing the actuator in a second state in which the actuator causes a next burst of one or more pulses of laser radiation produced by the laser system to have a second reference wavelength different from the first reference wavelength,
   the method further comprising a third step, performed between the step of placing the actuator in the first state and the step of placing the actuator in the second state, of pre-positioning the actuator in an intermediate state which is between the first state and the second state between the first burst and the next burst.

12. A method of controlling a laser system as claimed in claim 11 wherein the first state is a first position, the second state is a second position, and the third state is a third position between the first position and the second position.

13. A method of controlling a laser system, the method comprising:
   placing an actuator in a first state in which the actuator causes a first burst of one or more pulses of laser radiation produced by the laser system to have a first reference wavelength; and
   placing the actuator in a second state in which the actuator causes a next burst of one or more pulses of laser radiation produced by the laser system to have a second reference wavelength different from the first reference wavelength,
   wherein the step of placing the actuator in the second state comprises computing an optimal control waveform for the actuator to transition from the first state to the second state and causing the actuator to transition from the first state to the second state along a trajectory under control of the optimal control waveform.

14. A method of controlling a laser system as claimed in claim 13 wherein the computing of an optimal control waveform for the actuator to transition from the first state to the second state comprises using quadratic programming with constraints.

15. A method of controlling a laser system as claimed in claim 14 wherein the computing of an optimal control waveform for the actuator to transition from the first state to the second state comprises storing means for storing at least one optimal control parameter for each of a plurality of repetition rates.

16. A method of controlling a laser system as claimed in claim 15 wherein storing at least one optimal control parameter for each of a plurality of repetition rates is carried out using a pre-populated lookup table.

17. A method of controlling a laser system as claimed in claim 15 wherein storing at least one optimal control parameter for each of a plurality of repetition rates comprises using a field programmable gate array.

18. A method of controlling a laser system as claimed in claim 13 wherein the computing of an optimal control waveform for the actuator to transition from the first state to the second state comprises using dynamic programming.

19. A method of controlling a laser system as claimed in claim 13 wherein the computing of an optimal control waveform for the actuator to transition from the first state to the second state comprises using model inversion feedforward control.

20. A method of controlling a laser system as claimed in claim 13 wherein the computing of an optimal control waveform for the actuator to transition from the first state to the second state comprises using iterative learning control.

21. A method of controlling a laser system, the method comprising:
   placing an actuator in a first state in which the actuator causes a first burst of one or more pulses of laser radiation produced by the laser system to have a first reference wavelength; and
   placing the actuator in a second state in which the actuator causes a next burst of one or more pulses of laser radiation produced by the laser system to have a second reference wavelength different from the first reference wavelength,
   the method further comprising a third step, between the first burst and the next burst of pre-positioning the actuator in a third state which is intermediate the first state and the second state,
   wherein the step of placing the actuator in the second state comprises computing an optimal control waveform for causing the actuator to transition from the first state to the second state along an optimal trajectory.

* * * * *